THERMAL RMS LIMITER AND SEMICONDUCTOR DRIVING CIRCUIT MEANS

Filed March 10, 1967 2 Sheets-Sheet 1

INVENTOR
PETER L. RICHMAN

BY Arnold, Roylance, Kruger & Durkee
ATTORNEYS

Nov. 25, 1969 P. L. RICHMAN 3,480,835

THERMAL RMS LIMITER AND SEMICONDUCTOR DRIVING CIRCUIT MEANS

Filed March 10, 1967 2 Sheets-Sheet 2

INVENTOR
PETER L. RICHMAN

BY Arnold, Roylance, Kruger & Durkee
ATTORNEYS

United States Patent Office 3,480,835

Patented Nov. 25, 1969

3,480,835

THERMAL RMS LIMITER AND SEMICONDUCTOR DRIVING CIRCUIT MEANS

Peter L. Richman, Lexington, Mass., assignor to Weston Instruments, Inc., Newark, N.J., a corporation of Delaware Filed Mar. 10, 1967, Ser. No. 622,251

Int. Cl. H02h *5/04*

U.S. Cl. 317—41 5 Claims

ABSTRACT OF THE DISCLOSURE

A negative temperature coefficient resistor with a fast response is connected in parallel with a power sensitive load. Electrical signals to be delivered to the load are provided through a high gain amplifier having a low resistance output circuit of a type which has an accurately predetermined non-feedback resistance. A feedback resistor is connected between the load and a junction between an input resistor and the input terminal of the high gain amplifier. A typical load with which this circuit can be used is an RMS thermal converter.

This invention relates to apparatus for limiting the amplitude of electrical signals provided to a load device which is sensitive to excessive input power peaks for the purpose of protecting the load device.

In my U.S. patent application Ser. No. 522,733, now Patent No. 3,435,319, filed Jan. 24, 1966 and entitled RMS Converters, there are disclosed various embodiments of thermal converters which, in broad terms, perform the function of converting an input waveform to a DC output linearly proportional to the RMS value of the input waveform. As described therein, RMS converters utilize thermally sensitive elements, including the broad class of devices exhibiting electrical characteristics that vary with temperature. Temperature-varying electrical characteristics can include a change in one or more of the electrical properties of a device such as resistance, capacitance, inductance, and the like, or can include the generation of an electrical voltage or current, or can include an ancillary effect capable of detection by external sensors, such as a field effect.

In the above mentioned Richman application, the devices disclosed and described include heating elements which aid in the conversion of electricity to heat which is followed by a conversion back to electricity, the latter electrical signal usually being a DC signal which is proportional to the RMS value of the input waveform. In any such apparatus some conversion of electricity to heat is a part of the operation of the apparatus, this conversion generally involving some kind of element which is quite sensitive to temperature and which can be destroyed or at least seriously damaged by excessive input power.

One of the major advantages of RMS converters in general, including especially those described in the aforementioned application, is the fact that almost any waveform can be applied as the input signal and the converters are capable of generating a signal which is proportional to the RMS value of the applied waveform. Thus the RMS value of an input signal which is triangular or which consists of spaced pulses, for example, can be measured as well as one which is sinusoidal.

However, because of the temperature sensitivity of the thermal elements used in these converters it is possible that a waveform can be applied to the thermal converter which can cause damage to the thermally-sensitive element. Any general purpose RMS measuring system must be capable of handling irregular wave shaped, these including repetitive peaks of short duration and relatively great amplitude. For example, a pulse train consisting of pulses having amplitudes of 7 volts and a duty cycle of 1:49 has an RMS value of one volt. The thermal element of a prior art converter designed to measure 1 volt RMS full scale would function perfectly well. However, if a square wave of this amplitude were thus applied, the RMS amplitude would be 7 volts, or seven times too great. This extreme current would rapidly damage and probably destroy the thermal element.

This danger could be prevented by employing so-called "hard" limiting, i.e., by connecting a break-down device to the input terminals of the converter to shunt any peak voltages in excess of design values. However, any breakdown device which would be adequately protective would prevent measurement of many signals which are not of a type to cause damage such as pulse waveforms of the sort described above, and would thus severely limit the capability of the equipment and seriously decrease the accuracy thereof, defeating many of the functions of tthe equipment.

An object of the present invention is to provide apparatus for protecting thermally-sensitive loads from electrical input signals of excessive amplitude.

A further object is to provide apparatus for protecting thermal measuring devices from electrical input signals of excessive amplitude.

Another object is to provide means for limiting the power of signals applied to the thermoelements of a thermal converter to prevent damage to the thermoelements.

A further object is to provide an apparatus responsive to the heating effect of signals provided to a thermally sensitive load to limit the power of such electrical input signals when the heating effect exceeds a predetermined level.

Yet another object is to provide controlled signal shunting apparatus to protect a thermal element from damage due to overheating.

In order that the manner in which the foregoing and other objects are attained in accordance with the invention can be understood in detail, particularly advantageous embodiments thereof will be described with reference to the accompanying drawings, which form a part of this specification, and wherein.

The invention includes circuit means connected to ground between a source of input signals and a load, the circuit means including a resistor the resistance value of which rapidly decreases, due to self-heating, when supplied with electrical power in excess of a preselected level. The input signals are provided to a high gain amplifier which is followed by a low resistance output circuit connected to the temperature sensitive resistor and the load. A feedback circuit causes the amplifier apparatus to act as an operational amplifier which is incapable of providing greater power levels to the load when the temperature sensitive resistor enters the region of decreased resistance.

Stated differently, the apparatus of the invention includes a voltage feedback amplifier with an output circuit having an accurately controlled non-feedback output resistance and pre-selected output voltage limits, and with a thermistor having a pre-selected voltage-current characteristic so that when the total RMS output voltage exceeds a pre-selected limit, the output circuit absorbs the excess power and prevents this power from being delivered to the load.

Figure 1:
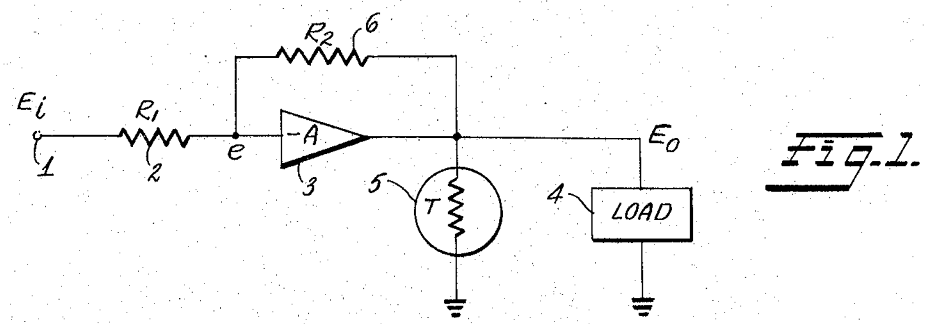
FIG. 1 is a schematic diagram of an apparatus in accordance with the broader aspects of the invention.

In FIG. 1 an input signal is applied to an input terminal 1 which is connected to one terminal of an input resistor 2 having a value $R_1$. The other terminal of resistor 2 is connected to the input terminal of a high gain amplifier 3. The output of amplifier 3 is connected to one terminal of a load device 4, the other terminal of which is connected to ground, the amplifier also being connected to one terminal of a negative temperature coefficient resistor 5. A feedback resistor 6 having a value $R_2$ is connected between the input and output terminals of the amplifier.

The amplifier drives the load in a conventional manner with an output potential $E_0$ which is related to the input voltage $E_i$ applied to input terminal 1 by the ratio of the feedback resistor to the input resistor, i.e., $$\frac{E_0}{E_i}=-\frac{R_2}{R_1}$$

To limit the RMS value of the voltage $E_0$ to prevent damage to the load, the temperature sensitive resistor 5 is connected in parallel circuit relationship with the load and the output circuitry of the feedback amplifier is modified in such a way that, operating in conjunction with the temperature sensitive resistor, an effective limit is attained.

Figures 2, 3:
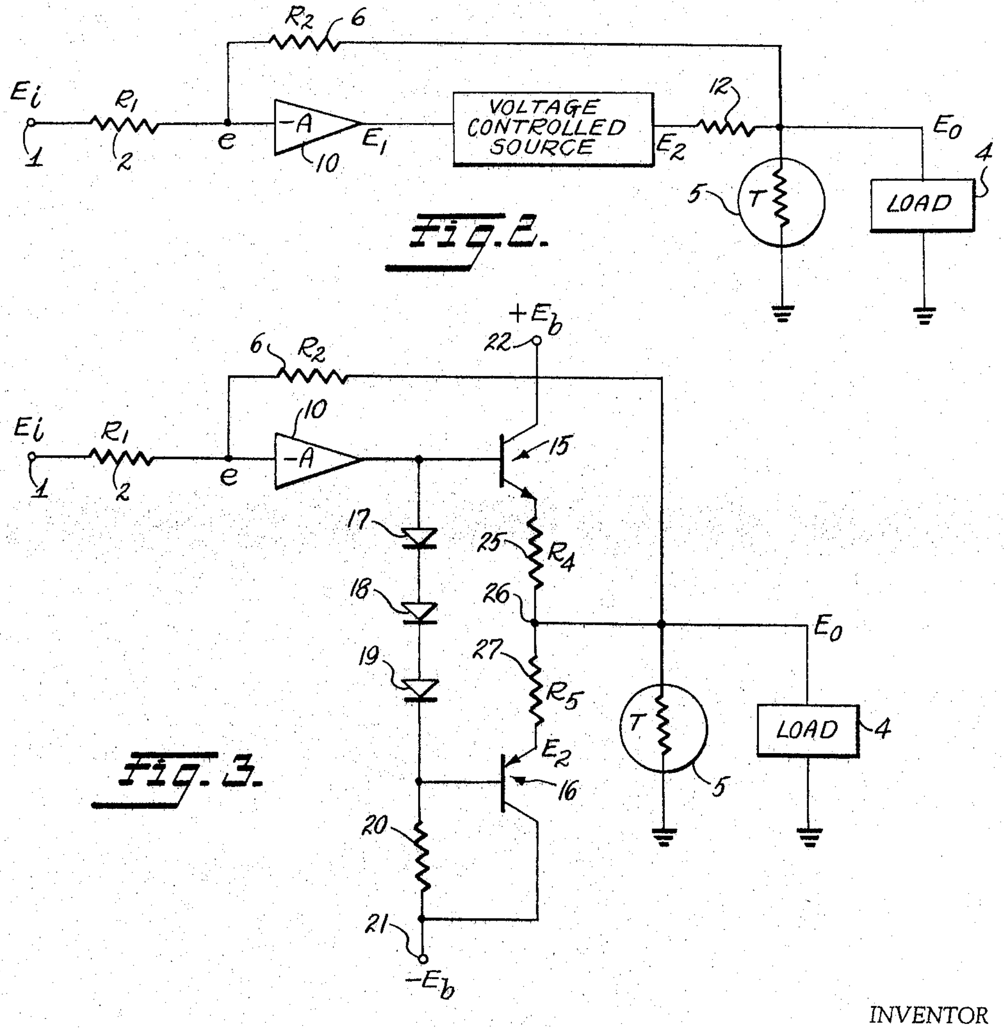
FIG. 2 is a schematic diagram of a second embodiment of the invention.
FIG. 3 is a schematic diagram of a third embodiment of the apparatus showing in greater detail an output circuit usable therewith.

This can be understood more clearly by referring to FIG. 2 in which the same reference numerals are used to indicate analogous components. In FIG. 2 the amplifier 3 has been modified to show a simple high gain amplifier 10 followed by a voltage controlled source 11 which has an output voltage $E_2$ which is equal to the product of the gain of amplifier 10 and the voltage $e$ at the input terminal of amplifier 10. The output impedance of the voltage controlled source is assumed to be effectively zero when compared with the other elements of the circuit. The output potential for the feedback amplifier system is supplied via a fixed resistor 12 which is connected in series with the voltage controlled source.

In the apparatus of FIG. 2 the resistance value of the temperature sensitive resistor 5 is chosen to be greater than the impedence of load 4 for all RMS values of output potential $E_0$ less than the pre-selected upper limit which the load can withstand without damage. As the RMS value of the output voltage increases, increased current flow through resistor 5 causes it to heat and in turn causes a significant decrease in the resistance value of that resistor and resistors 12 and 5 act as a voltage divider causing the output potential applied to the load to drop drastically below the level at which the feedback can maintain the output level, and then well below the level at which the voltage could damage the load. It will be recognized that in the normal operational amplifier operation, the output voltage $E_0$ would normally follow the input signal with a gain factor determined by the ratio of the feedback and input resistors as previously described. However, with resistor 5 at a decreased resistance level the absolute output voltage limit imposed by the supply voltage for the output stage causes the voltage feedback loop effectively to open for the peaks of any RMS signals which exceed the pre-selected limit as determined by the circuit values and voltage supplies.

An important aspect of the invention is that the temperature variable resistor 5 need not be a precision device, and need not have particularly accurate or stable values as it would have to be if it were inserted, for example, in series with feedback resistor 6. During the time that the voltage output $E_0$ is being normally delivered to the load resistor 5 merely constitutes a somewhat imprecise load on the feedback amplifier which should be designed with sufficient gain to supply the output voltage even if the total load impedence on the feedback amplifier varies over a range of, for example, five percent to ten percent. This feature allows a relatively low cost temperature sensitive resistor to be used and completely eliminates the need to accurately test, stabilize, or select a particular device to perform the protection function.

Fast-response variable resistance devices are available on the market at the present time, one such device being a thermistor bead which can have a representative time constant of 0.12 second so that the protecting circuit can respond before damage is done. A typical characteristic for a thermistor which exhibits a resistance of 200 ohms at 25 degrees centigrade shows that the thermistor decreases to a resistance of 12.6 ohms at 100° C., 1.2 ohms at 200° C. and 0.24 ohm at 300° C. Thus, resistor 12 can be established at, for example, 10 ohms, so that relatively little power is lost in the series resistor during normal operation but the resistance drop of resistor 5 soon reaches the order of magnitude of the series resistor when subjected to relatively little excess power. A value of 10 ohms for resistor 12 and 200 ohms for the 25° C. value of resistor 5 are representative values usable with a 50 ohm load.

It should be further emphasized that a significant advantage of apparatus constructed in accordance with the present invention is that it constitutes a limiter which is based on RMS values. But, when the applied signals have RMS values less than the critical values at which limiting will occur, large wave form crest factors, i.e., maximum to maximum level ratios, up to, for example, 7:1 can be tolerated for the input and output wave forms from the amplifier apparatus, even though the RMS limits may be at a ratio of, for example, 1.4:1. Thus, the apparatus can read full scale RMS values with high crest factors accurately until such time as the RMS value becomes excessive before any limiting value will occur. Alternatively, the apparatus can render RMS information with small crest factor ratios up to the maximum RMS value or which the apparatus was designed.

FIG. 3 shows in greater detail a protection circuit wherein a specific embodiment of a voltage controlled source and output resistance are shown. In FIG. 3 the amplifier, feedback resistor, input circuitry and the load and temperature sensitive resistance are identified as in FIGS. 1 and 2. The voltage controlled source and output resistance include a conventional NPN transistor indicated generally at 15, the base electrode of transistor 15 being connected to the output terminal of amplifier 10. A conventional PNP transistor indicated generally at 16 has a base elecrode which is connected to the cathode end of a series circuit including conventional semi-conductor diodes 17, 18 and 19. Diodes 17–19 are all poled in the same direction, the anode end of the diode series circuit being connected to the output of amplifier 10. The base electrode of transistor 16 is also connected to one terminal of a fixed resistor 20 which is connected to a DC source terminal 21, terminal 21 being supplied with a negative DC voltage $E_b$. The collector electrode of transistor 16 is also connected to the negative DC source at terminal 21. The collector electrode of transistor 15 is connected to a DC source terminal 22 which is supplied by a source of positive DC voltage $E_b$.

The emitter electrode of transistor 15 is connected to one terminal of a fixed resistor 25, the other terminal of which is connected to a junction 26 which is connected to the load, resistor 5, and resistor 6. The emitter electrode of transistor 16 is connected to junction 26 via a fixed resistor 27.

Transistors 15 and 16 and the associated circuit elements are connected as a typical voltage controlled source which is a bi-directional emitter follower circuit. Diodes 17–19 and resistor 20 constitute a biasing circuit for transistors 15 and 16. Resistor 20 maintains a current flow through the series diode circuit which establishes voltage drops across the diode junctions to compensate for the base-emitter voltage drops in the transistors and the small voltage drops in resistors 25 and 27, which are relatively low value resistors, so that the quiescent operating points of the transistors are properly established. It is important that some form of biasing circuit be used in this manner so that the transistors 15 and 16 can conduct symmetrically when an alternating wave form is supplied thereto without the necessity for the input wave form having to overcome the base emitter junction voltage drops before conduction to the load can be achieved.

Resistors 25 and 27, having values $R_4$ and $R_5$ respectively, are the equivalent resistors to resistor 12 in the circuit of FIG. 2. Resistor 25 constitutes the equivalent of resistor 12 when positive going signals are applied to the apparatus and when transistor 15 is conductive. Likewise, resistor 27 is the equivalent of resistor 12 for negative going signals. These resistors therefore function alternately as the series resistors, and should be of equal values. As with resistor 12, resistors 25 and 27 should have relatively low values.

Figure 4:
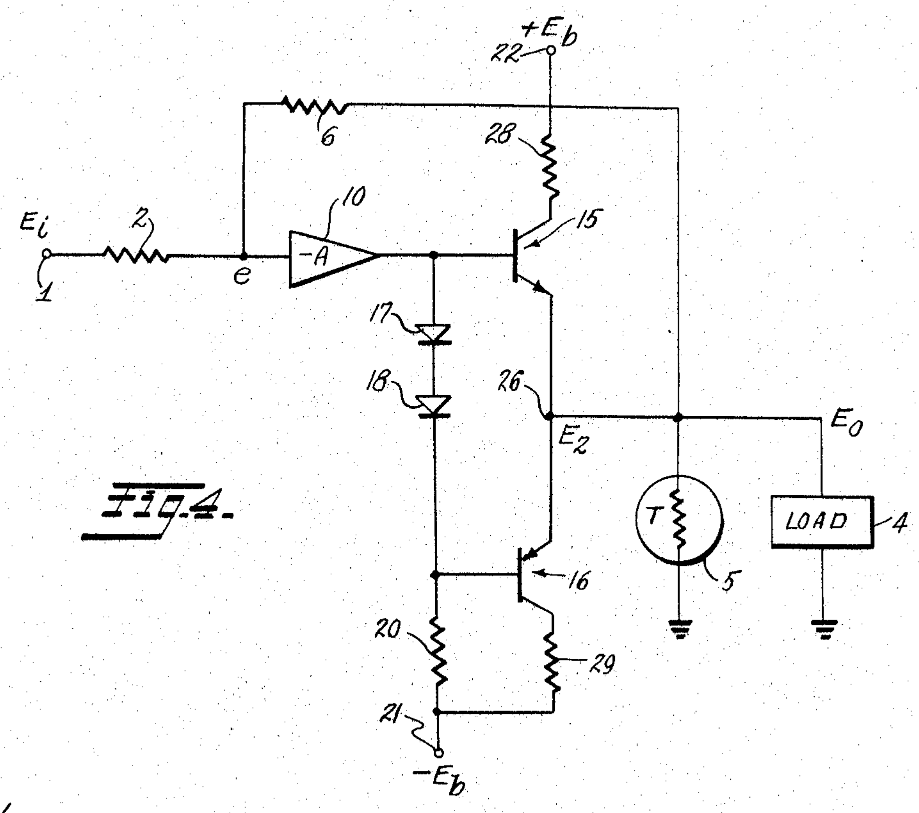
FIG. 4 is a schematic diagram of a fourth embodiment of the apparatus showing in detail an output circuit usable therewith.

In FIG. 4, a further embodiment of the apparatus is shown wherein the resistance arrangement in the output circuit is changed. The reference numerals in FIG. 4 are the same as those for the analogous elements of the apparatus of FIG. 3 and will not be discussed again. The difference in FIG. 4 resides in the connection of resistors in the emitter-collector circuits of transistors 15 and 16, and the emission of diode 19 to restore correct biasing. As will be seen by comparing FIGS. 3 and 4, resistor 25 and 27 of FIG. 3 have been removed from FIG. 4 and replaced by conductors. The resistors to perform the necessary limiting operation are placed in the collector circuits of the respective transistors. A resistor 28 is connected between the collector electrode of transistor 15 and positive DC terminal 22. A resistor 29 is connected between the collector electrode of transistor 16 and negative DC terminal 21. With this circuit arrangement, the non-feedback output impedance of the output stage is equal to the output impedance of a pure emitter-follower circuit, alternately the impedance of the circuit including transistors 15 or 16. The resistances of resistors 28 and 29 do not enter into the calculation of the output impedance of an emitter-follower circuit to a first approximation. Thus, a lower output impedance to the load circuit is obtainable in the circuit of FIG. 4 than in the circuit of FIG. 3. However, as the resistance of thermistor 5 decreases when an RMS overload exists, substantial current is drawn by resistor 5 in an attempt to maintain $E_0$ correct in its relationship to $E_I$ as determined by the operational amplifier and resistors 6 and 2. This current flows through resistors 28 and 29 and causes a decrease in the collector electrode voltages of those transistors. Thus, adequate voltage can no longer be supplied to the load and the load voltage operating level is therefore limited. The effect of this action is to open the feedback loop circuit, the load again being limited by the positive supply potential divided by the value of resistor 28 for positive-going signals and the negative supply potential divided by the value of resistor 29 for negative-going signals.

It should be recognized that the embodiment of FIG. 4 is actually quite different from the embodiment of FIGS. 2 or 3 in that the resistors in the output circuit of the voltage controlled source are no longer series resistances in the same sense as resistor 12 in FIG. 2, or resistors 25 and 27 in FIG. 3. The operation of resistors 28 and 29 is significantly different because those resistors have no effect until after the limiting action begins, and therefore have substantially no effect on the output impedance of the output stage until the operation of the apparatus enters the limiting phase of its operation.

Figure 5:
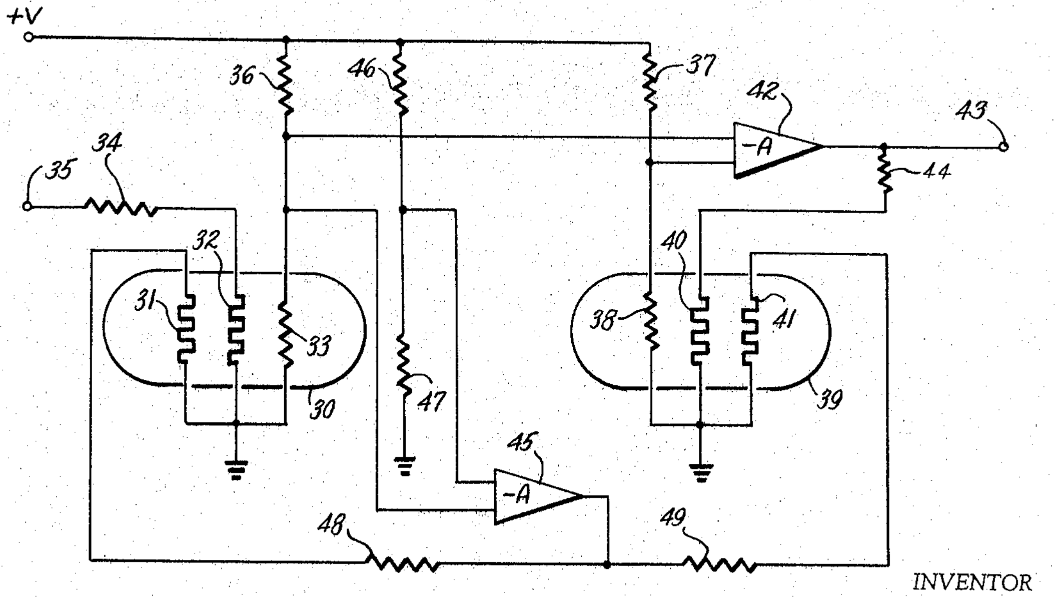
FIG. 5 is a schematic diagram of a thermal converter of a type protectable with the apparatus of the present invention.

FIG. 5 shows a thermal converter of the type shown and described in the previously-mentioned Richman application Ser. No. 522,733 now Patent No. 3,435,319 which is one type of load with which the circuit of FIGS. 1–3 can be effectively used. The circuit of FIG. 5 includes a thermistor thermoelement 30, thermoelement 30 including a heater element 31, a heater element 32, and a thermistor 33 which is thermally coupled to heater elements 31 and 32. Heater 32 is connected via an input resistor 34 to an input terminal 35 to which input signals are provided. A fixed resistor 36 is connected in series circuit relationship with thermistor 33 between a source of positive DC voltage and ground, forming one leg of a bridge circuit. A fixed resistor 37 is connected in series circuit relationship with a thermistor 38 between the DC source and ground to form the other leg of the bridge circuit. Thermistor 38 forms the temperature sensitive element of a thermal element 39 which also includes heater elements 40 and 41. The error signal developed across the bridge appears at the intermediate junctions in the two series circuits, these junctions being connected to the input terminals of a high gain DC amplifier 42, the output of amplifier 42 being connected to the converter output terminal 43 at which the usable output voltage appears.

A linearizing circuit includes an amplifier 45 the input terminals to which are connected to the junction in the first leg of the bridge and also to the intermediate junction in a voltage divider circuit including series connected resistors 46 and 47 between the positive DC supply and ground. The output of amplifier 45 is connected via resistors 48 and 49 to heater elements 31 and 41 respectively to provide a corrective linearizing signal to thermal elements 30 and 39.

The circuit of FIG. 5 is described in function and operation more fully in Richman application Ser. No. 522,733 and need not be described in detail here. The important aspect of the circuit for purposes of the present description is that heater element 32 and thermistor 33 can operate effectively with the remaining circuitry to accept an input wave form of nearly any shape and can provide at terminal 43 a DC voltage proportional to the RMS value of the input wave form. This is true over a relatively wide range of RMS values and wave form shapes, including those with high crest factors. However, the heater and thermistor elements can be seriously damaged or destroyed by RMS voltages which exceed the design ratings for the apparatus. Hence, a protective circuit of some type is necessary, the type disclosed in FIGS. 1–4 being especially useful for this purpose. Thus, the circuit of FIG. 5 can be substituted for load circuit 4 in FIGS. 1–4 with terminal 35 being connected to receive voltage $E_0$.

While certain advantageous embodiments have been chosen to illustrate the invention, it will be understood by those skilled in the art that various changes and modifications can be made therein without departing from the scope of the invention.

What is claimed is:

1. A protective input circuit for delivering limited power to a load which is sensitive to excessive input power signals comprising the combination of a temperature sensitive resistor connected in parallel circuit relationship with the load, the resistance value of said resistor being on the same order as the impedance of the load under normal power input conditions, said resistor being characterized by a rapid decrease in resistance when the parallel circuit including said resistor and said load is subjected to input signals exceeding a preselected power level, said resistor being further characterized by a relatively short thermal response time; a signal input terminal to which an electrical alternating voltage can be applied; and driving circuit means interconnecting said signal input terminal and said load for providing to said load a driving voltage proportional to the input voltage applied at said input terminal, said driving circuit means including a high gain inverting amplifier having an input terminal and an output terminal; an input resistor interconnecting said signal input terminal and said amplifier input terminal; a feedback resistor interconnecting said amplifier input terminal and the load; a first transistor of one conductivity type, said transistor having an emitter electrode, a base electrode and a collector electrode; a second transistor of the opposite conductivity type having a base electrode, an emitter electrode and a collector electrode; a first and second circuit means interconnecting said amplifier output terminal and said base electrodes of said first and second transistors, respectively; resistance circuit means interconnecting said emitter electrodes of said first and second transistors; and third circuit means connecting the load to a point intermediate the ends of said resistance circuit means.

2. An apparatus according to claim 1 wherein said collector electrode of said first transistor is connected to a source of DC voltage of one polarity, and said collector electrode of said second transistor is connected to a source of DC voltage of the opposite polarity.

3. An apparatus according to claim 1 wherein said driving circuit means further comprises a plurality of semiconductor diodes connected in series circuit relationship between the base electrodes of said first and second transistors, said diodes all being poled in the same direction.

4. An apparatus according to claim 3 wherein said driving circuit means further comprises a resistor connected in series circuit relationship between one end of the series circuit comprising said plurality of diodes and a point of reference potential.

5. A protective input circuit for delivering limited power to a load which is sensitive to excessive input power signals comprising the combination of a temperature sensitive resistor connected in parallel circuit relationship with the load, the resistance value of said resistor being on the same order as the impedance of the load under normal power input conditions, said resistor being characterized by a rapid decrease in resistance when the parallel circuit including said resistor and said load is subjected to input signals exceeding a preselected power level, said resistor being further characterized by a relatively short thermal response time; a signal input terminal to which an electrical alternating voltage can be applied; and driving circuit means interconnecting said signal input terminal and said load for providing to said load a driving voltage proportional to the input voltage applied at said input terminal, said driving circuit means comprising a high gain inverting amplifier having an input terminal and an output terminal; an input resistor interconnecting said signal input terminal and said amplifier input terminal; a feedback resistor interconnecting said amplifier input terminal and the load; a first transistor of one conductivity type, said transistor having an emitter electrode, a base electrode and a collector electrode; a second transistor of the opposite conducivity type having a base electrode, an emitter electrode and a collector electrode; first and second circuit means interconnecting said amplifier output terminal and said base electrodes of said first and second transistors, respectively; circuit means interconnecting said emitter electrodes of said first and second transistors; third circuit means connecting the load to said circuit means; and first and second resistance circuit means connected in the collector circuits of said first and second transistors, respectively.

References Cited

UNITED STATES PATENTS

| | | | |
|---|---|---|---|
| 894,705 | 7/1908 | Schattner | 317—41 X |
| 2,284,423 | 5/1942 | Hansell | 317—41 X |
| 3,185,934 | 5/1965 | Patmore et al. | 307—202 X |
| 3,267,376 | 8/1966 | Harries | 324—105 X |
| 3,361,967 | 1/1968 | Noveske | 324—106 |
| 3,375,455 | 3/1968 | Motta | 330—17 X |
| 3,428,908 | 2/1969 | Locanthi | 330—24 X |

OTHER REFERENCES

Hewlett-Packard Journal, "An RMS-Responding Voltmeter with High Crest Factor Rating," vol. 15, No. 5, January 1964.

JOHN F. COUCH, Primary Examiner

N. H. BEHA, Jr., Assistant Examiner

U.S. Cl. X.R.

330—11, 24, 143

Disclaimer and Dedication 3,480,835.—*Peter L. Richman*, Lexington, Mass. THERMAL RMS LIMITER AND SEMICONDUCTOR DRIVING CIRCUIT MEANS. Patent dated Nov. 25, 1969. Disclaimer and dedication filed Mar. 17, 1971, by the assignee, *Weston Instruments, Inc.*

Hereby enters this disclaimer to the remaining term of said patent and dedicates said patent to the Public.

[*Official Gazette April 27, 1971.*]